US008070408B2

(12) United States Patent
Behdjat et al.

(10) Patent No.: US 8,070,408 B2
(45) Date of Patent: Dec. 6, 2011

(54) LOAD LOCK CHAMBER FOR LARGE AREA SUBSTRATE PROCESSING SYSTEM

(75) Inventors: Mehran Behdjat, San Jose, CA (US);
Shinichi Kurita, San Jose, CA (US);
Makoto Inagawa, Palo Alto, CA (US);
Suhail Anwar, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 533 days.

(21) Appl. No.: 12/199,341

(22) Filed: Aug. 27, 2008

(65) Prior Publication Data
US 2010/0054905 A1 Mar. 4, 2010

(51) Int. Cl.
*H01L 21/677* (2006.01)
(52) U.S. Cl. ..................................... 414/217
(58) Field of Classification Search ............... 414/217, 414/180, 937, 939, 935; 141/8, 65; 454/187
See application file for complete search history.

(56) References Cited

U.S. PATENT DOCUMENTS

| | | | |
|---|---|---|---|
| 5,751,003 A | | 5/1998 | Rose et al. |
| 5,753,904 A | * | 5/1998 | Gil et al. ............ 250/222.1 |
| 6,059,507 A | * | 5/2000 | Adams ................ 414/217 |
| 6,291,800 B1 | | 9/2001 | Shirakawa et al. |
| 6,382,895 B1 | * | 5/2002 | Konishi et al. ........ 414/217 |
| 6,473,993 B1 | | 11/2002 | Yagi et al. |
| 7,207,766 B2 | * | 4/2007 | Kurita et al. .......... 414/641 |
| 7,388,895 B2 | | 6/2008 | Gong et al. |
| 2003/0150849 A1 | | 8/2003 | Beer et al. |
| 2006/0196422 A1 | * | 9/2006 | Hiroki ................ 118/719 |
| 2007/0006936 A1 | | 1/2007 | Hosokawa et al. |
| 2007/0166133 A1 | * | 7/2007 | Lee et al. ............. 414/217 |
| 2007/0280816 A1 | * | 12/2007 | Kurita et al. .......... 414/806 |

FOREIGN PATENT DOCUMENTS
KR 10-0561703 A 6/2000
KR 10-2005-0003272 1/2005

OTHER PUBLICATIONS
International Search Report and Written Opinion for PCT/US2009/055200 (APPM/013572PCT) dated Mar. 24, 2010.

* cited by examiner

*Primary Examiner* — Saul Rodriguez
*Assistant Examiner* — Glenn Myers
(74) *Attorney, Agent, or Firm* — Patterson & Sheridan, L.L.P.

(57) ABSTRACT

The present invention generally includes a load lock chamber for transferring large area substrates into a vacuum processing chamber. The load lock chamber may have one or more separate, environmentally isolated environments. Each processing environment may have a plurality exhaust ports for drawing a vacuum. The exhaust ports may be located at the corners of the processing environment. When a substrate is inserted into the load lock chamber from the factory interface, the environment may need to be evacuated. Due to the exhaust ports located at the corners of the environment, any particles or contaminants that may be present may be pulled to the closest corner and out of the load lock chamber without being pulled across the substrate. Thus, substrate contamination may be reduced.

16 Claims, 7 Drawing Sheets

LOAD LOCK CHAMBER FOR LARGE AREA SUBSTRATE PROCESSING SYSTEM

BACKGROUND OF THE INVENTION

1. Field of the Invention

Embodiments of the invention generally relate to a load lock chamber for transferring large area substrates into a vacuum processing environment.

2. Description of the Related Art

When processing substrates to manufacture flat panel displays, organic light emitting displays (OLEDs), solar panels, and semiconductors, multiple processes may be performed in order to achieve the desired end product. Some of the processes may be performed under vacuum. Examples of vacuum processes that may be used include plasma enhanced chemical vapor deposition (PECVD), physical vapor deposition (PVD), etching, and others.

When multiple vacuum processes are performed, it may be beneficial to have the different chambers coupled to a common transfer chamber. By coupling a plurality of processing chambers to a common vacuum chamber, the substrate may have a first process performed on it in a first chamber. Thereafter, the substrate may be removed into the transfer chamber and then inserted into the second chamber where a second, separate process may occur. To reduce the evacuation time, the transfer chamber may be maintained at a vacuum level similar to the vacuum level of the processing chambers.

Prior to and/or after the vacuum processing, the substrates may move through a non-vacuum environment. The substrates may enter and exit the system through a factory interface that is maintained at atmospheric pressure. Thus, there may be an abrupt change in vacuum level between the transfer chamber and the factory interface.

A load lock chamber may be used to reduce and/or prevent the abrupt pressure change. The load lock chamber may be evacuated to a pressure substantially identical to the pressure of the transfer chamber to permit the substrate enter and/or exit the transfer chamber. Additionally, the load lock chamber may be vented to atmosphere so that the pressure of the load lock chamber is substantially identical to the pressure of the factory interface. Thus, the load lock chamber may reduce and/or prevent an abrupt pressure change between the factory interface and the transfer chamber.

Therefore, there is a need in the art for a load lock chamber capable of maintaining a vacuum.

SUMMARY OF THE INVENTION

The present invention generally includes a load lock chamber for transferring large area substrates into a vacuum processing chamber. The load lock chamber may have one or more separate, environmentally isolated environments. Each processing environment may have a plurality of exhaust ports for drawing a vacuum. The exhaust ports may be located at the corners of the processing environment. When a substrate is inserted into the load lock chamber from the factory interface, the environment may need to be evacuated. Due to the exhaust ports located at the corners of the environment, any particles or contaminants that may be present may be pulled to the closest corner and out of the load lock chamber without being pulled across the substrate. Thus, substrate contamination may be reduced.

In one embodiment, the present invention generally includes an apparatus for transferring large area substrates into a vacuum processing chamber. The apparatus may include a chamber body having a plurality of sides. The chamber body may be sized to receive at least one substrate. One or more openings may be present and sized to permit insertion and removal of the at least one substrate. A plurality of openings may be sized to permit evacuating and venting of the chamber body.

In another embodiment, an apparatus includes a transfer chamber, and a load lock chamber coupled to the transfer chamber. The load lock chamber includes a chamber body having a plurality of openings formed therethrough. A first of the openings is formed through a first wall is sized to permit a substrate to pass therethrough. A second of the openings is separate from the first of the openings formed through a second wall that is coupled with the transfer chamber and is sized to permit a substrate to pass therethrough. Third and fourth openings each separate from the first and second openings are formed through the chamber body. The third and fourth openings are coupled with one or more vacuum pumps.

In another embodiment, a substrate transfer chamber includes a chamber body having a first side adapted for coupling to a vacuum chamber, a second side adapted for coupling to a factory interface and a third side coupling the first and second sides, N vertically stacked single substrate load lock chambers forming a unitary body coupled to the transfer chamber, where N is an integer greater than two, N−1 interior walls, each interior wall separating and environmentally isolating adjacent substrate load lock chambers and a plurality of openings formed on the N−1 interior walls sized to permit evacuating and venting of the chamber body, wherein one or more vacuum pumps are coupled to the plurality of vertically stacked single substrate load lock chambers at the plurality of openings.

In still another embodiment, a method includes: placing a substrate into a load lock chamber, matching pressure in the load lock chamber to the pressure in a transfer chamber, using one or more vacuum pumps to evacuate the load lock chamber through one or more openings positioned in separate corners in the load lock chamber, wherein the gases are evacuated through the corners with the closest opening and the vacuum pump coupled thereto, and transferring processed substrate from the load lock chamber by robotic arm.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention generally includes a load lock chamber for transferring large area substrates into a vacuum processing chamber. The load lock chamber may have one or more separate, environmentally isolated environments. Each processing environment may have a plurality of exhaust ports for drawing a vacuum. The exhaust ports may be located at the corners of the processing environment. When a substrate is inserted into the load lock chamber from a factory interface, the environment may need to be evacuated. Due to the exhaust ports located at the corners of the environment, any particles or contaminants that may be present may be pulled to the closest corner and out of the load lock chamber without being pulled across the substrate. Thus, substrate contamination may be reduced.

The invention is illustratively described below in regards to a load lock chamber, such as those available from AKT America, Inc., a subsidiary of Applied Materials, Inc., Santa Clara, Calif. However, it should be understood that the invention has utility in other system chambers, including those sold by other manufacturers.

Figure 1:
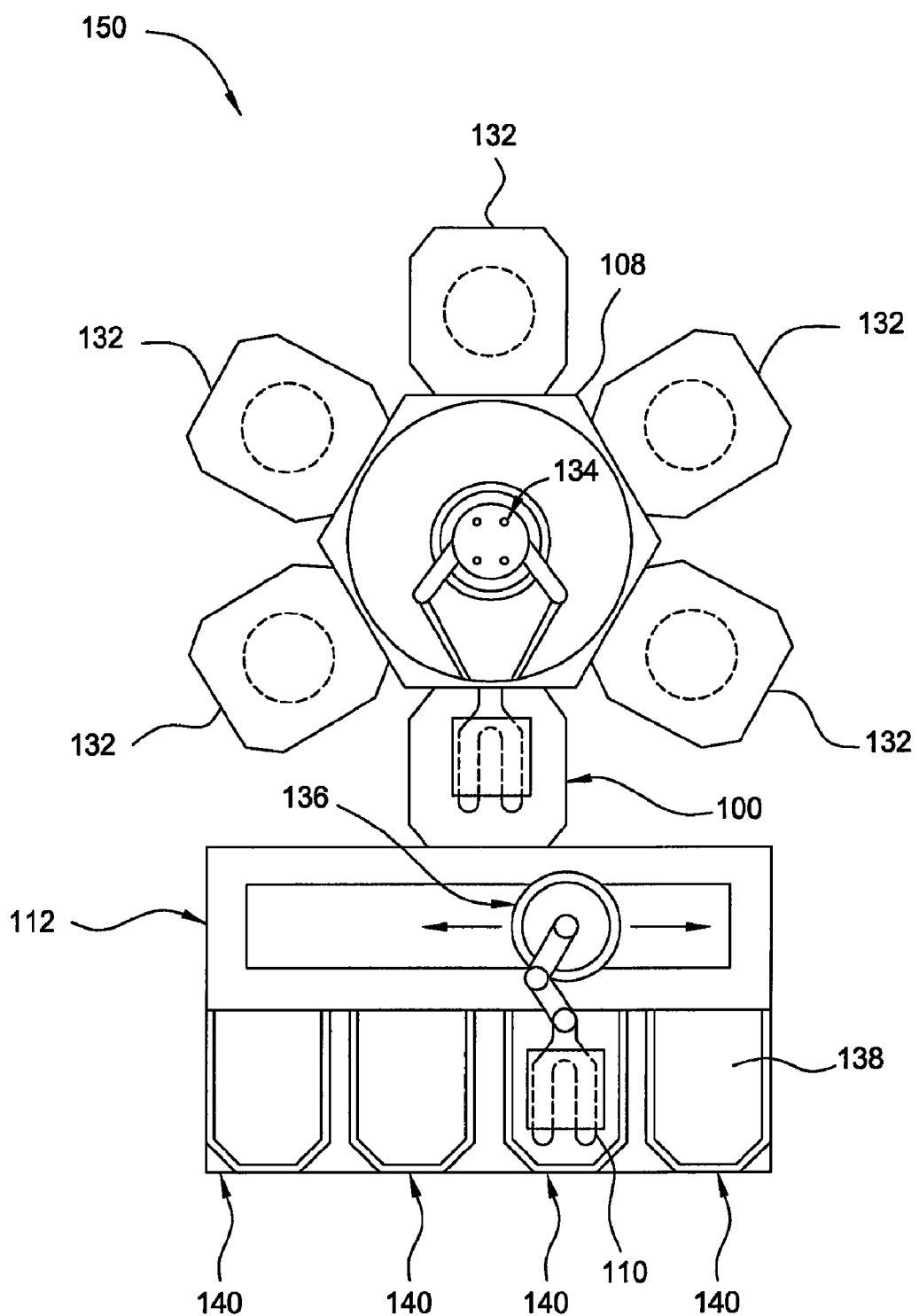
FIG. 1 is a top plan view of one embodiment of a processing system 150 for processing large area substrates.

FIG. 1 is a top plan view of one embodiment of a process system 150 suitable for processing large area substrates (e.g., substrates having a plan area greater than about 1.0 square meter). The process system 150 may include a transfer chamber 108 coupled to a factory interface 112 by a load lock chamber 100. The transfer chamber 108 may have at least one dual blade vacuum robot 134 disposed therein that is adapted to transfer substrates between a plurality of circumscribing process chambers 132 and the load lock chamber 100. In one embodiment, one of the process chambers 132 is a pre-heat chamber that thermally conditions substrates prior to processing to enhance throughput of the system 150. The transfer chamber 108 may be maintained at a vacuum condition to eliminate the necessity of adjusting the pressures between the transfer chamber 108 and the individual process chambers 132 after each substrate transfer.

The factory interface 112 may include a plurality of substrate storage cassettes 138 and a dual blade atmospheric robot 136. The cassettes 138 may be removably disposed in a plurality of bays 140 formed on one side of the factory interface 112. The atmospheric robot 136 may transfer substrates 110 between the cassettes 138 and the load lock chamber 100. The factory interface 112 may be maintained at or slightly above atmospheric pressure.

Figure 2:
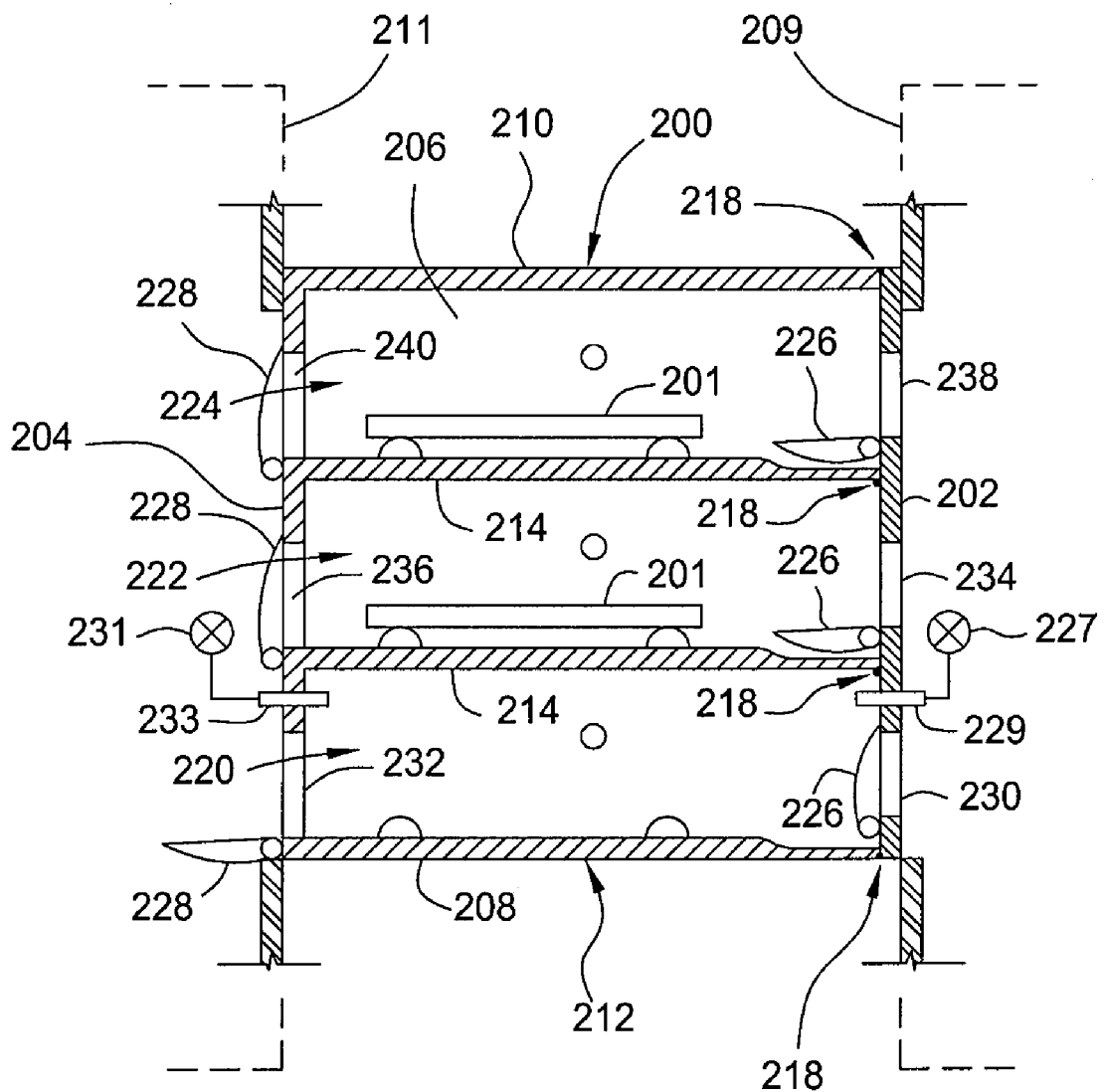
FIG. 2 is a cross sectional view of one embodiment of a multiple chamber load lock chamber 200.

FIG. 2 is a cross sectional view of one embodiment of a multi-chamber load lock chamber 200. The load lock chamber 200 has a chamber body 212 that includes a plurality of vertically-stacked, environmentally-isolated chambers that are separated by vacuum-tight, horizontal interior walls 214. Although three single substrate chambers 220, 222, 224 are shown in the embodiment depicted in FIG. 2, it is contemplated that the chamber body 212 of load lock chamber 200 may include two or more vertically-stacked chambers. For example, the load lock chamber 200 may include N substrate transfer chambers separated by N−1 horizontal interior walls 214, where N is an integer greater than one. The substrate chambers 220, 222, 224 are each configured to accommodate a single large area substrate 201 so that the volume of each chamber may be minimized to enhance fast pumping and vent cycles.

The chamber body 212 includes first sidewall 202, a second sidewall 204, a third sidewall 206, a bottom 208 and a top 210. The body 212 may be fabricated from a rigid material suitable for use under vacuum conditions. In one embodiment, the chamber body 212 is fabricated from a single block (e.g., one piece) of aluminum. Alternatively, the chamber body 212 may be fabricated from modular sections, each modular section comprising a portion of one of the substrate chambers 220, 222, 224, and assembled in a fashion suitable to maintain vacuum integrity, such as continuous welds shown by reference numeral 218.

In the embodiment depicted in FIG. 2, the interior walls 214 and the remaining portions of the chamber body 212 other than the second sidewall 206 may be fabricated from a single contiguous mass of material. The second sidewall 206 may be sealably coupled to the other portions of the chamber body 212 to facilitate machining of the substrate chambers 220, 222, 224 and to allow access to the interior portions of the chamber body 212 during fabrication and assembly.

Each of the substrate chambers 220, 222, 224 defined in the chamber body 212 includes two substrate access ports. The ports are configured to facilitate the entry and egress of substrates 201 from the load lock chamber 200. In the embodiment depicted in FIG. 2, the first substrate chamber 220 disposed at the bottom 208 of the chamber body 212 includes a first substrate access port 230 and a second substrate access port 232. The first substrate access port 230 is formed through the first sidewall 202 of the chamber body 212 and couples the first substrate chamber 220 to a central transfer chamber 209 of the processing system. The second substrate access port 232 is formed through the second wall 204 of the chamber body 212 and couples the first substrate chamber 220 to the factory interface 211. In the embodiment depicted in FIG. 2, the substrate access ports 230, 232 are disposed on opposite sides of the chamber body 212, however, the parts 230, 232 may alternatively positioned on adjacent walls of the body 212.

Each of the substrate access ports 230, 232 is selectively sealed by a respective slit valve 226, 228 adapted to selectively isolate the first substrate chamber 220 from the environments of the transfer chamber 209 and the factory interface 211. The slit valves 226, 228 are moved between an open and closed position by an actuator. In the embodiment depicted in FIG. 2, each of the slit valves 226, 228 is pivotally coupled to the chamber body 212 along a first edge and rotated between the open and closed position by the actuator.

The first slit valve 226 seals the first substrate access port 230 from the interior side of the first sidewall 202 and is thereby positioned within the first substrate chamber 220 such that a vacuum (e.g., pressure) differential between the first substrate chamber 220 and the vacuum environment of the central transfer chamber assists in loading and sealing the slit valve 226 against the first sidewall 202, thereby enhancing the vacuum seal. In the embodiment depicted in FIG. 2, the internal pressure in the first substrate chamber 220 may be maintained by using a vent valve 227 which may be opened and closed and allowing venting gas into the first substrate chamber 220 through a vent port 229, therefore raising the pressure within the internal volume of the load lock chamber 200. After the substrates have been processed, the internal pressure and the vacuum environment may then be reduced by using a vacuum pump 231 to evacuate the processing gas from the first substrate chamber 220 through one or more vacuum ports 233. Correspondingly, the second slit valve 228 is disposed on the exterior of the second sidewall 204 and is thereby positioned such that the pressure differential between the ambient environment of the factory interface and the vacuum environment of the first substrate chamber 220 assists in sealing the second substrate access port 232.

The second chamber 222 is similarly configured with access ports 234, 236 and slit valves 226, 228. Likewise, the third chamber 224 is configured with access ports 238, 240 and slit valves 226, 228.

Referring additionally to FIG. 2, when the pressures between the transfer chamber 209 and the first substrate chamber 220 of the load lock chamber 200 are substantially equal, the slit valve 226 may be opened to allow processed substrates to be transferred to the load lock chamber 200 and substrates to be processed and transferred to the transfer chamber 209 by the vacuum robot through the first substrate access port 230. After placing the substrate returning from the transfer chamber 209 in the first substrate chamber 220 of the load lock chamber 200, the slit valve 226 is closed and a vent valve 227 is opened thereby allowing venting gas, for example $N_2$ and/or He, into the first substrate chamber 220 of the load lock chamber 200 through the vent port 229 and raising the pressure within the internal volume of the load lock chamber 200. After the substrates have been processed, the internal pressure is again reduced by using the vacuum pump 231 to evacuate the processing gas from the first substrate chamber 220 through the vacuum ports 233. Once the pressure within the first substrate chamber 220 is substantially equal to that of the factory interface 211, the slit valve 224 opens, thus allowing the atmospheric robot to transfer substrates between the first substrate chamber 220 and the substrate storage cassettes coupled to the factory interface 211 through the second substrate access port 232.

The other chambers 222, 224 are similarly configured. Although each of the substrate chambers 220, 222, 224 may be coupled with individual pumps (not shown), one or more of the substrate chambers 220, 222, 224 may share a single vacuum pump equipped with appropriate flow controls to facilitate selective pumping between chambers.

Figure 3:
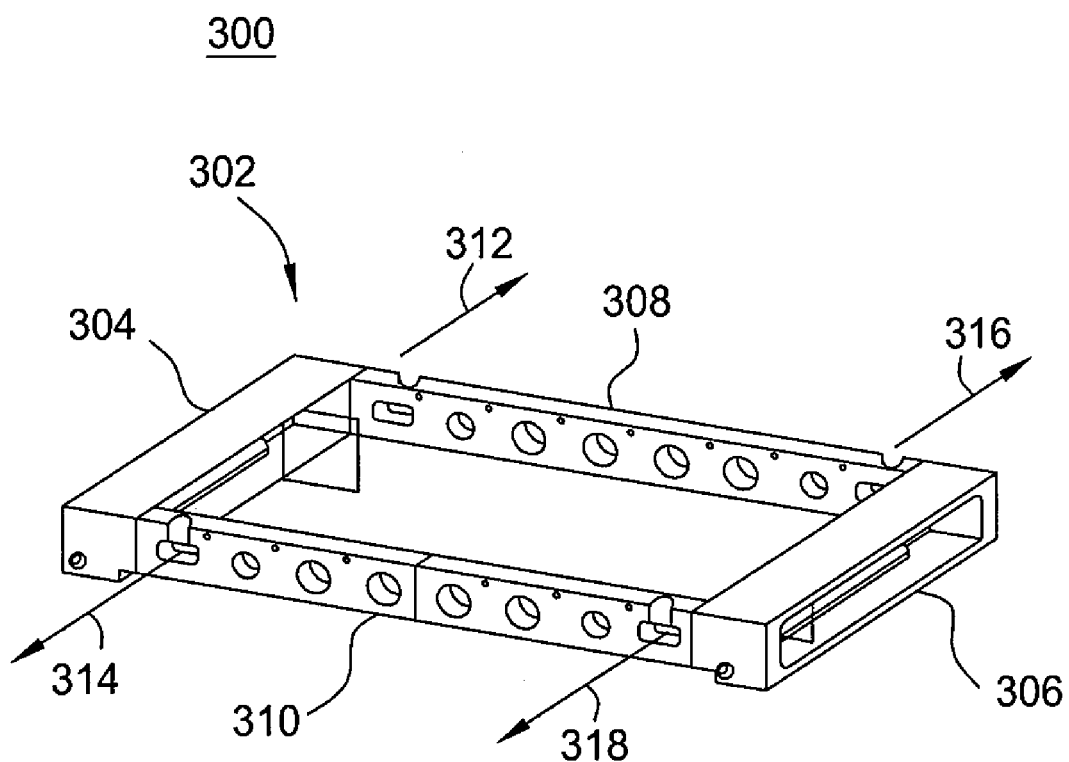
FIG. 3 is a schematic drawing of a modular section 300 of the load lock chamber according to one embodiment of the invention.

FIG. 3 is a schematic drawing of a modular section 300 of a load lock chamber according to one embodiment of the invention. In the embodiment shown in FIG. 3, the modular section 300 includes a main body 302 which further includes substrate access ports 304 and 306, and sidewalls 308 and 310. A vent port and at least one vacuum port may be positioned on the ends of the sidewall 308 and 310 and each vacuum port may be coupled to a vacuum pump. When the vacuum pump is activated to bring the pressure within the chamber to a level equal to the transfer chamber, particulates exit through the vacuum ports may follow in the direction of the arrow 312, 314, 316 and 318 as indicated. With multiple vacuum ports, during evacuation, the particulates may be drawn and exit through the closest vacuum ports. Therefore when evacuating the chamber, any particulates may efficiently moved out of the chamber without passing over the substrate. Also, the distance in which the particulates pass through the substrate surface to the closest vacuum ports may also be reduced with regard to the positioning of the vacuum ports. Thus, contamination of the substrate may be reduced. In one embodiment, the distance in which the particulates travel through the load lock chamber to reach the closest vacuum port about ½ of the longest wall.

Figure 4A:
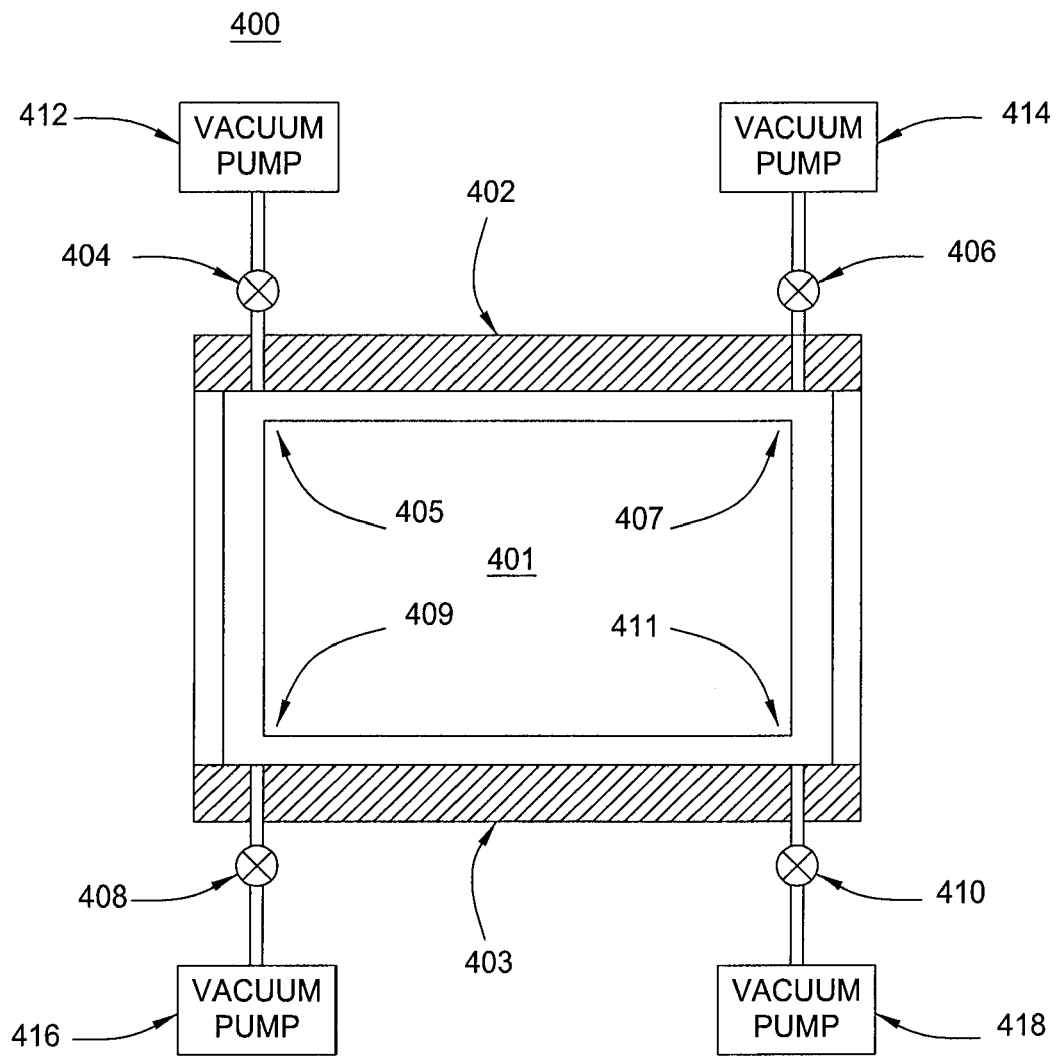
FIG. 4A is a top view of a load lock chamber 400 according to one embodiment of the invention.

FIG. 4A is a top view of a load lock section 400 according to one embodiment of the invention. In this embodiment, on sidewall 402 are vacuum ports 404 and 406, and on sidewall 403 are vacuum ports 408 and 410. Each of the vacuum ports 404, 406, 408, and 410 is positioned apart from each other and at opposite ends of the sidewalls. Each of the vacuum ports 404, 406, 408, and 410 are coupled with its own vacuum pump 412, 414, 416, and 418. When the vacuum pumps 412, 414, 416, and 418 are activated, particulates within the substrate chamber may be evacuated through the closest vacuum port 404, 406, 408, and 410 without crossing over the substrate 401 and each of the vacuum pumps 412, 414, 416, and 418 may also be able to control the flow rate through the vacuum ports associated with the individual vacuum pumps 412, 414, 416, and 418.

The flowing direction of the particulates is indicated by arrows 405, 407, 409, and 411. When the vacuum pumps 412, 414, 416, and 418 are activated, each of the vacuum pumps 412, 414, 416, and 418 may pull the particulates toward the closest vacuum ports 404, 406, 408, and 410, as indicated by the arrows 405, 407, 409, and 411, and evacuate through the vacuum ports 404, 406, 408, and 410. By evacuating the particulates through the closest vacuum ports, fewer particulates may be pulled across the substrate, therefore contamination of the substrates by the particulates within the chamber may be minimized. In one embodiment, the plurality of vacuum pumps 412, 414, 416, 418 may be configured substantially identically to pull roughly the same vacuum level at each pumping location. In another embodiment, one or more vacuum pumps 412, 414, 416, 418 may be configured differently to pull a different vacuum level at each pumping location.

Figure 4B:
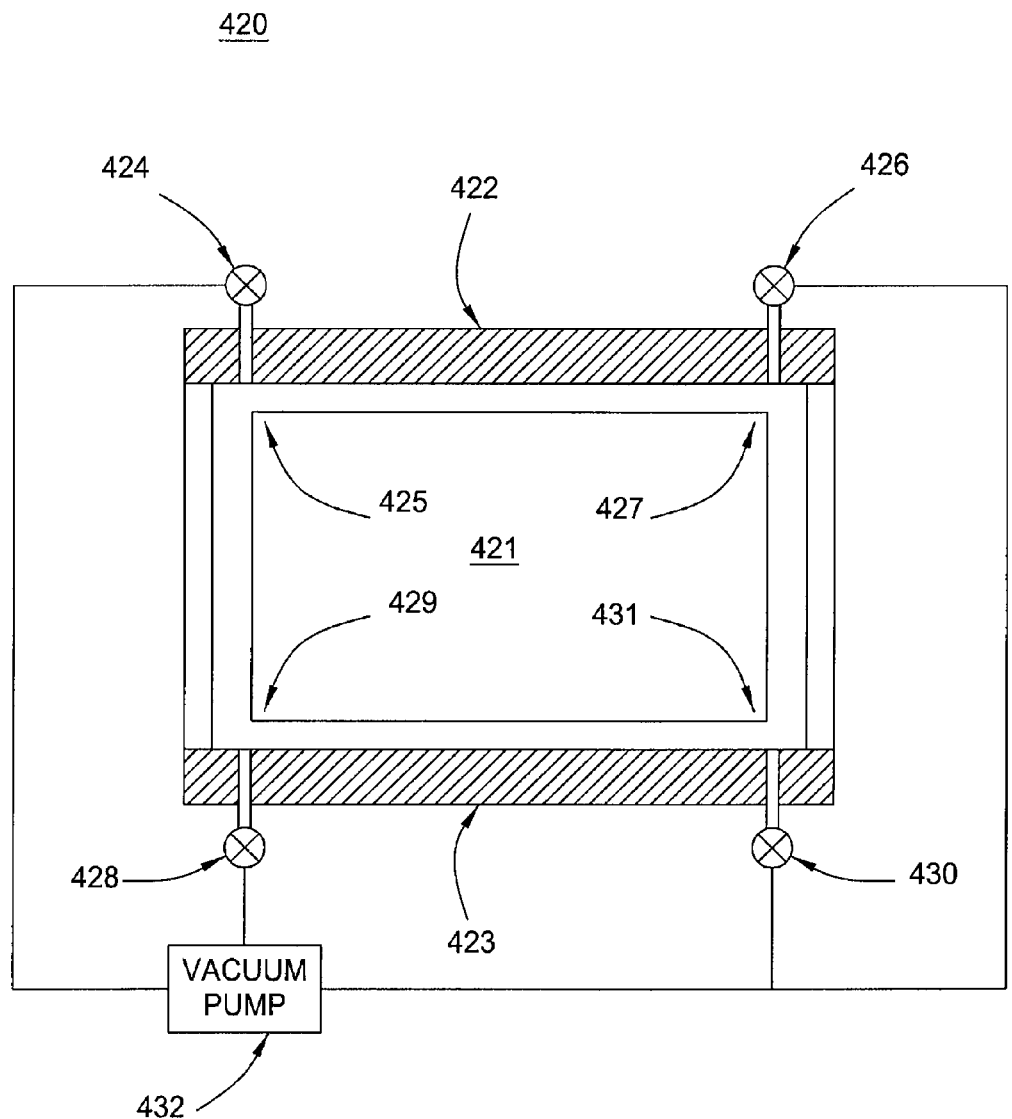
FIG. 4B is a top view of another load lock chamber 420 according to another embodiment of the invention.

FIG. 4B is a top view of another load lock chamber 420 according to another embodiment of the invention. In this embodiment, two vacuum ports 424 and 426 are positioned on sidewall 422, and two vacuum ports 428 and 430 are positioned on sidewall 423. Each of the vacuum ports 424, 426, 428 and 430 is positioned apart from each other and at opposite ends of the sidewalls 422 and 423. Each of the vacuum ports 424, 426, 428 and 430 shares a common vacuum pump 432. When the common vacuum pump 432 is activated, the common vacuum pump 432 may evenly pull the particulates toward the closest vacuum ports 424, 426, 428 and 430, as indicated by the flow direction arrow 425, 427, 429 and 431, and evacuate the particulates through the vacuum ports 424, 426, 428 and 430 without crossing over the substrate 421, therefore minimizing the risk of contamination of the substrate by the particulates.

Figure 5:
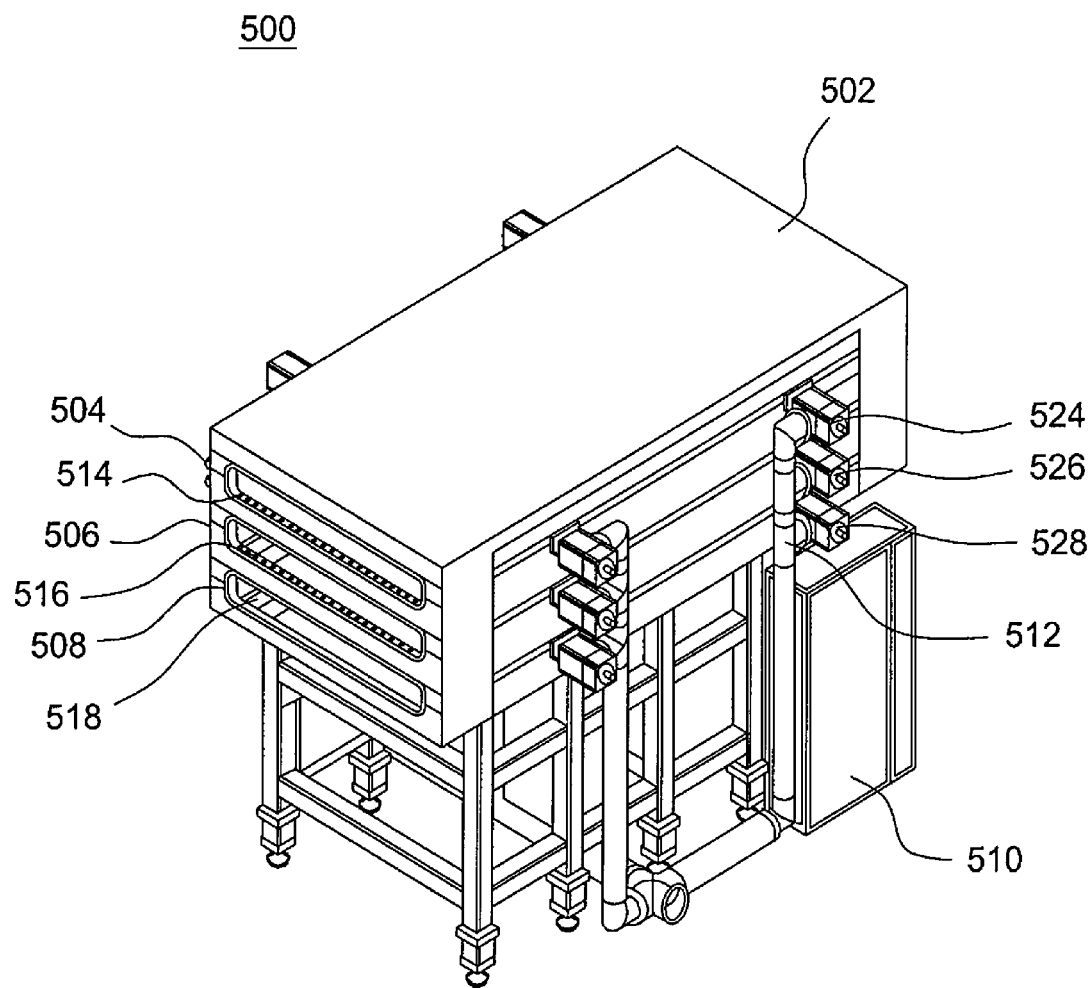
FIG. 5 is a schematic drawing of a load lock chamber 500 according to one embodiment of the invention.

FIG. 5 is a schematic drawing of a load lock chamber 500 according to one embodiment of the invention. In the embodiment shown in FIG. 5, the load lock chamber 500 includes a chamber body 502 comprising vertically stacked modular sections 504, 506, and 508. Each of the modular sections 504, 506, and 508 includes substrate access ports 514, 516, and 518. On the sidewall of each of the modular sections 504, 506, and 508 are multiple vacuum ports 524, 526, and 528. In one embodiment, the vacuum ports 524, 526, and 528 may be positioned on the sidewall above the plane of the substrate. In another embodiment, the vacuum ports 524, 526, and 528 may be positioned on the sidewall below the plane of the substrate. The vacuum ports 524, 526, and 528 may be grouped vertically as a set and may be connected to a vacuum pump 510 through a vacuum pipe 512. In this embodiment, only one vacuum pump is shown and is connected to the set of vacuum ports. However, other embodiment may use one vacuum pump for each set of vertically stacked vacuum ports, or one vacuum pump for each vacuum port depending on the process parameter. Also, by stacking the modular sections in a vertical fashion, the integrity of the modular section may be enhanced and distortion to the modular section caused by the vacuum suction may also be reduced.

Figure 6:
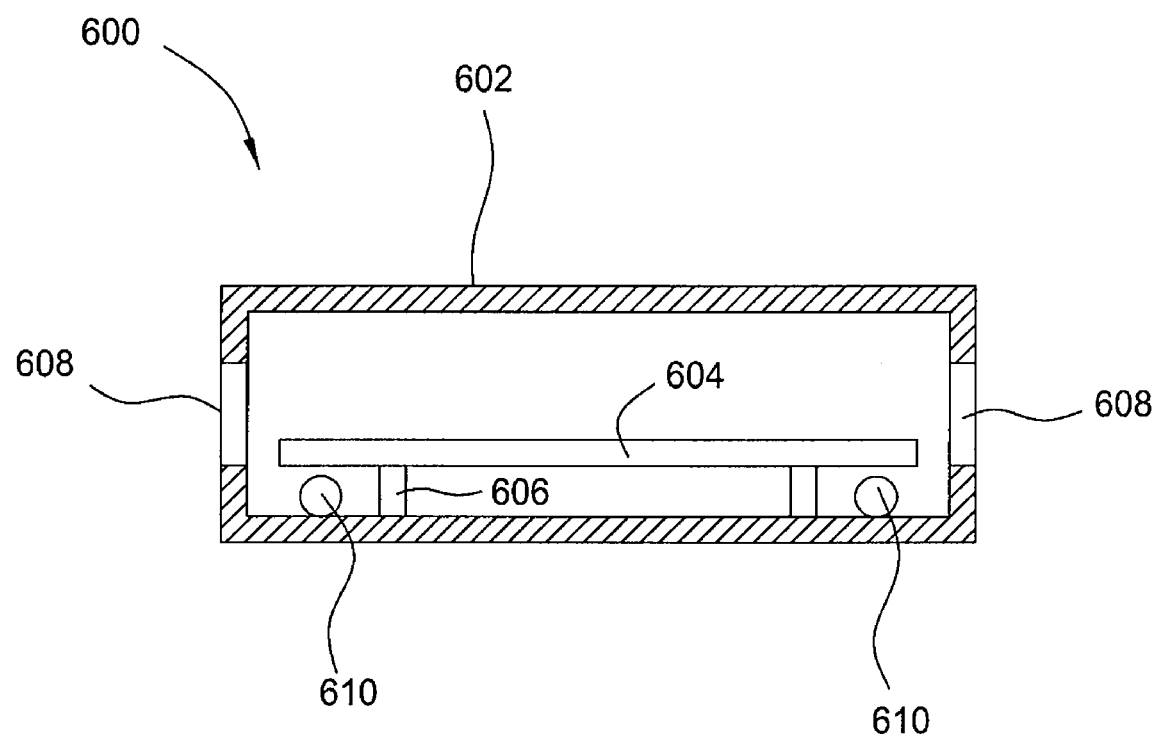
FIG. 6 is a schematic sectional view of a load lock chamber 600 according to another embodiment of the invention.

FIG. 6 is a schematic sectional view of a load lock chamber 600 according to another embodiment of the invention. The load lock chamber 600 includes a chamber body 602 having a slit valve opening 608 disposed through opposite walls of the body 602. One or more substrates 604 may be supported within the body 602 by one or more substrate supports 606. A plurality of openings 610 may be present within the chamber body 602 to permit processing gases to be evacuated from the chamber body 602. The openings 610 may be smaller than the slit valve openings 608 which are sized to permit substrates to enter and exit the chamber body 602. The openings 610 may be disposed below the substrate receiving surface of the one or more substrate supports 606 upon which the substrate 604 rests. The openings 610 permit processing gas to be withdrawn from the chamber body 602 at the corners of the body 602 such that the processing gas and hence, any particles, may be pulled out of the chamber body 602 through the closes opening 610. Thus, the particles and processing gas may be withdrawn from the chamber body such that the maximum distance that the particles and/or processing gas travels is about ½ of the longest wall within the chamber body 602. Additionally, by having a plurality of openings 610 for evacuation, the amount of distortion of the chamber body may be reduced. When a plurality of chambers share a common wall, the common wall may deflect or distort when the chambers are at different vacuum levels. The plurality of openings 610 may reduce the distortion and/or deflection.

By drawing vacuum at the corners of the chamber, any particulates in the chamber may be pulled out by the vacuum pumps and evacuated through the vacuum ports at the corners of the chamber closest thereto. Thus, the amount of particulates that may be present in the chamber that are pulled across the substrate may be reduced. By reducing the amount of particles pulled across the substrate, the risk of contaminating the substrate is greatly minimized.

While the foregoing is directed to embodiments of the present invention, other and further embodiments of the invention may be devised without departing from the basic scope thereof, and the scope thereof is determined by the claims that follow.

The invention claimed is:

1. An apparatus, comprising:
a chamber body having a plurality of sidewalls, the chamber body sized to receive at least one substrate, one or more first openings through a first sidewall that is sized to permit insertion and removal of the at least one substrate, a plurality of second openings disposed through a second sidewall that is coupled to the first sidewall and are sized to permit evacuating and venting of the chamber body, wherein the second openings are coupled to one or more vacuum devices for the evacuation of a processing gas, a plurality of third openings disposed through a third sidewall that is coupled to the first sidewall and are sized to permit evacuating and venting of the chamber body, wherein the third openings are coupled to one or more vacuum devices for the evacuation of the processing gas, and one or more fourth openings through a fourth sidewall that is sized to permit insertion and removal of the at least one substrate, wherein the fourth sidewall is coupled to both the second sidewall and the third sidewall and wherein the plurality of second openings and the plurality of third openings include a plurality of vacuum ports positioned apart from each other and at opposite ends of the sidewalls.

2. The apparatus of claim 1, wherein the one or more vacuum devices comprises a plurality of vacuum pumps with one vacuum pump coupled to each second opening.

3. The apparatus of claim 1, wherein each of the plurality of second openings comprises at least one vent port and at least one vacuum port.

4. The apparatus of claim 3, wherein a first vacuum port of the at least one vacuum port is positioned at the second sidewall and a second vacuum port is positioned at the third sidewall.

5. The apparatus of claim 3, wherein each of the vacuum ports are coupled with a separate vacuum pump.

6. The apparatus of claim 1, wherein the one or more vacuum devices comprises a vacuum pump coupled with a plurality of the second openings.

7. An apparatus, comprising:
N vertically stacked single substrate load lock chambers forming a unitary body, where N is an integer greater than two, the load lock chambers each having a first wall having a first opening therethrough that is sized to permit a substrate to pass therethrough, the load lock chambers each having a second wall having a second opening therethrough having dimensions substantially equal to the dimensions of the first opening;
N–1 interior walls, each interior wall separating and environmentally isolating adjacent substrate load lock chambers;
a plurality of third walls coupled between the first and second walls, each load lock chamber having two third walls coupled between the first and second walls, each third wall having a plurality of third openings therethrough having dimensions smaller than the dimensions of the first openings, wherein the plurality of openings are positioned apart from each other and at opposite ends of the third walls; and
one or more vacuum pumps coupled to the third walls at the third openings.

8. The apparatus of claim 7, wherein each third wall has two third openings.

9. The apparatus of claim 8, wherein a single vacuum pump is coupled to the plurality of third openings on the plurality of third walls.

10. The apparatus of claim 8, wherein N is three.

11. The apparatus of claim 7, wherein a single vacuum pump is coupled to the N vertically stacked single substrate load lock chambers.

12. The apparatus of claim 11, wherein the plurality of openings in the plurality of third walls are located below a substrate receiving surface in each load lock chamber.

13. The apparatus of claim 7, wherein the plurality of openings in the plurality of third walls are located below a substrate receiving surface in each load lock chamber.

14. The apparatus of claim 7, wherein N is three.

15. The apparatus of claim 14, wherein a single vacuum pump is coupled to the plurality of openings on the plurality of third walls.

16. The apparatus of claim 15, wherein the plurality of openings in the plurality of third walls are located below a substrate receiving surface in each load lock chamber.

* * * * *